United States Patent [19]

Swart

[11] Patent Number: 5,898,314
[45] Date of Patent: Apr. 27, 1999

[54] TRANSLATOR FIXTURE WITH FORCE APPLYING BLIND PINS

[75] Inventor: Mark A. Swart, Anaheim Hills, Calif.

[73] Assignee: Delaware Capital Formation, Inc., Wilmington, Del.

[21] Appl. No.: 08/606,593

[22] Filed: Feb. 26, 1996

[51] Int. Cl.⁶ .................................................. G01R 31/02
[52] U.S. Cl. ........................ 324/761; 324/754; 324/757
[58] Field of Search ................................... 324/761, 754, 324/755, 757, 758

[56] References Cited

U.S. PATENT DOCUMENTS

| | | | |
|---|---|---|---|
| 4,352,061 | 9/1982 | Matrone | 324/754 |
| 4,496,903 | 1/1985 | Paulinski | 324/761 |
| 4,774,462 | 9/1988 | Black | 324/758 |
| 5,157,325 | 10/1992 | Murphy | 324/761 |
| 5,493,230 | 2/1996 | Swart et al. | 324/754 |
| 5,500,606 | 3/1996 | Holmes | 324/761 |
| 5,672,978 | 9/1997 | Kimura | 324/754 |

FOREIGN PATENT DOCUMENTS 0315707  5/1989  European Pat. Off. .

*Primary Examiner*—Ernest F. Karlsen
*Assistant Examiner*—Russell M. Kobert
*Attorney, Agent, or Firm*—Christie, Parker & Hale, LLP

[57] ABSTRACT

A translator fixture for a printed circuit board tester has a pattern of test probes on a base upon which the translator fixture is mounted. The translator fixture includes a plurality of essentially parallel and vertically spaced apart rigid translator plates supported in a fixed position in the translator fixture. Selected patterns of holes are aligned in the translator plates for containing and supporting translator pins extending through the translator plates and for positioning the translator pins for contacting test points under pressure on a printed circuit board supported in an essentially horizontal position between the translator plates. The pins translate electrical test signals between the test points on the printed circuit board and the test probes on the base of the tester. The fixture includes a plurality of blind pins positioned in a top plate of the fixture for non-electrically applying a balancing force to the printed circuit board. The blind pins are positioned in blind holes in the top plate adjacent a surface of the printed circuit board at locations where no test points are located and opposite to a surface on the printed circuit board having the translator pins applying pressure to the test points.

10 Claims, 3 Drawing Sheets

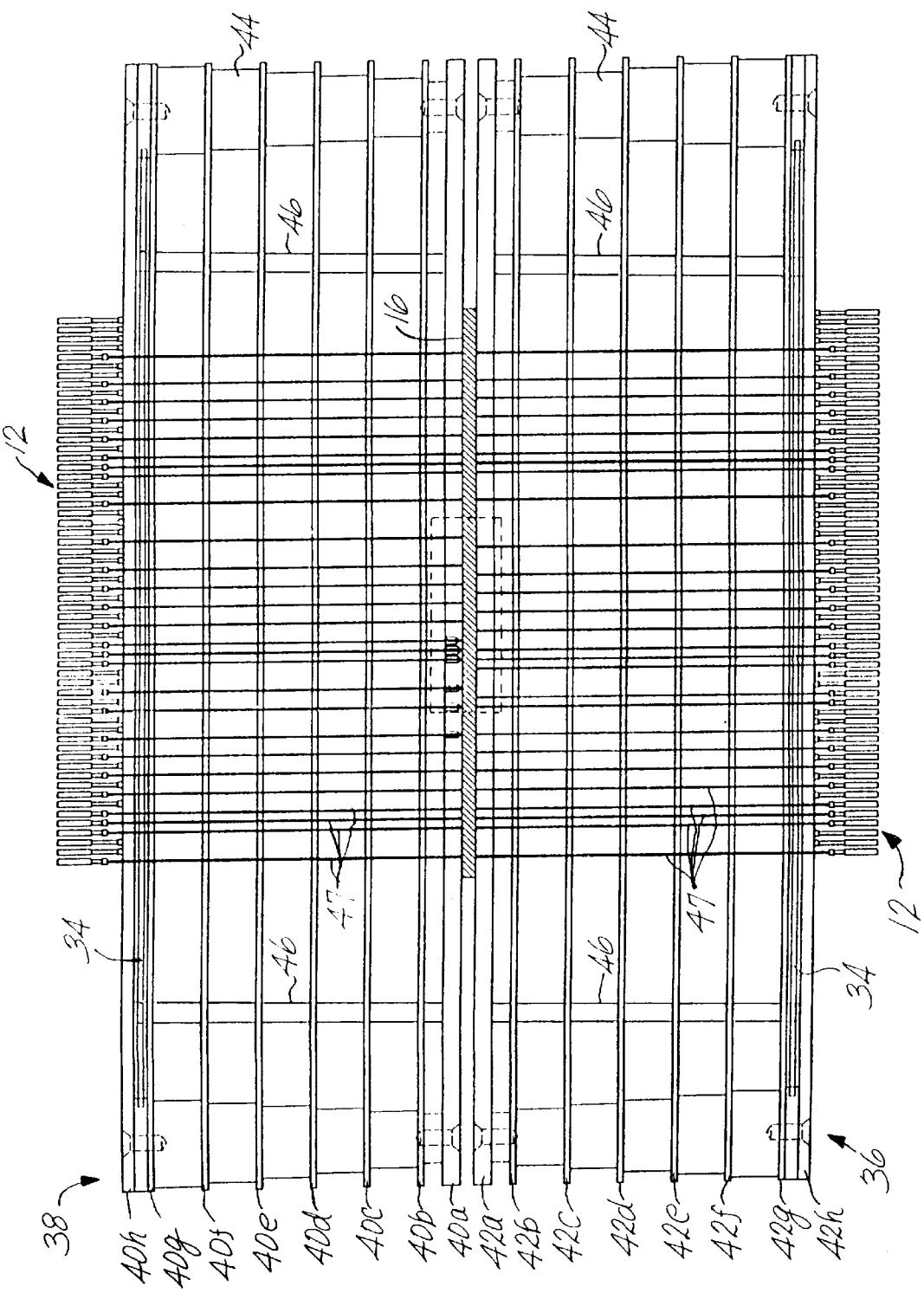

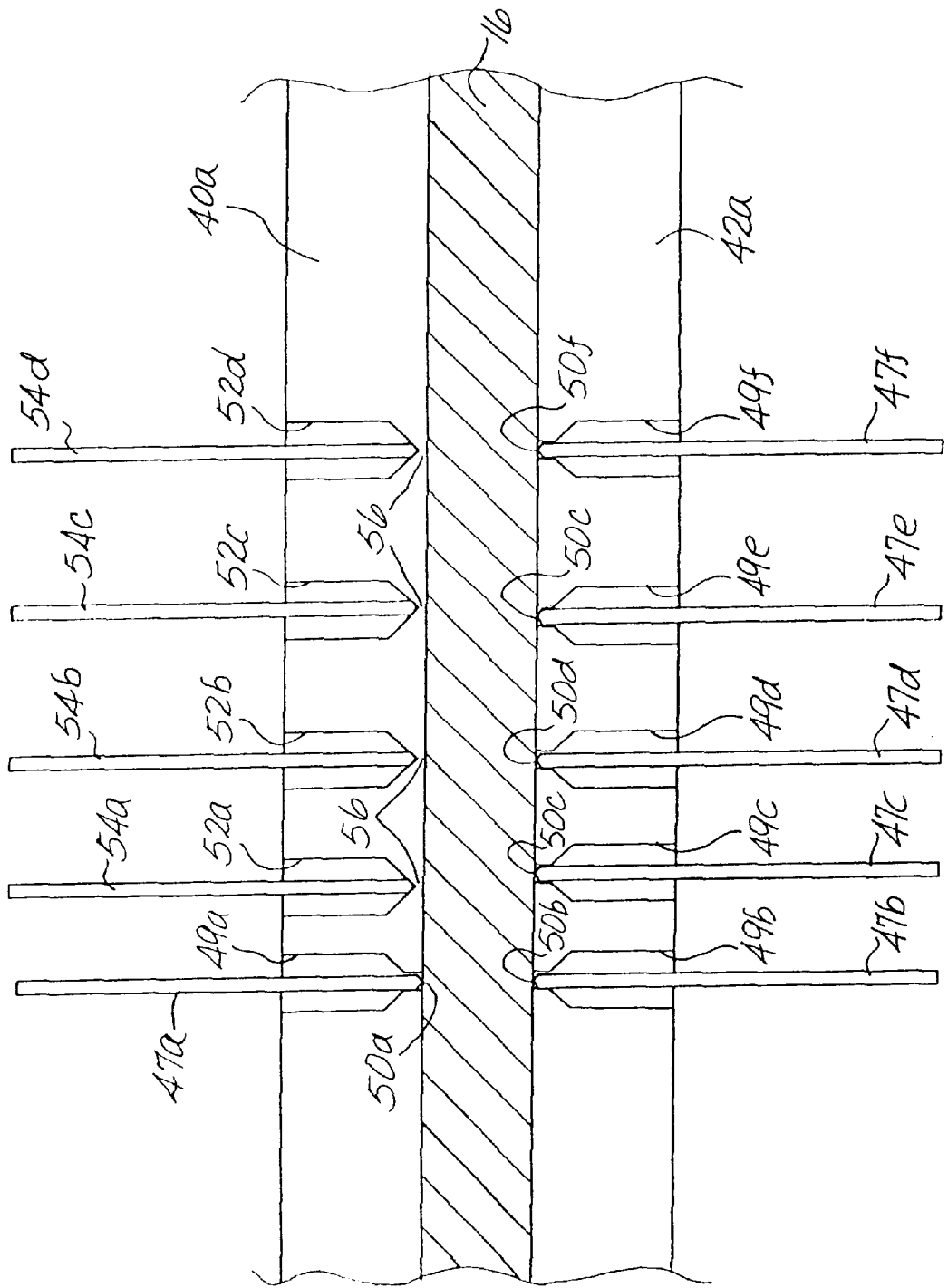

TRANSLATOR FIXTURE WITH FORCE APPLYING BLIND PINS

FIELD OF THE INVENTION

This invention relates to the automatic testing of bare printed circuit boards, and more particularly, to a translator fixture for translating test signals from a board under test to a pattern of test probes in a tester, in which the fixture has blind translator pins to counteract the force applied by test pins contacting the printed circuit board.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where the larger and more complex and expensive electronic test analyzers are not practical.

As mentioned previously, the customized wired test fixtures are one class of fixtures for transmitting signals from the fixture to the external circuit tester. A further class of test fixtures is the so-called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins"" are used as the translator pins. The tilt pins are straight solid pins mounted in corresponding pre-drilled holes in translator plates which are part of the translator fixture. The tilt pins can tilt in various three-dimensional orientations to translate separate test signals from the off-grid random pattern of test points on the board to the grid pattern of test probes in the grid base.

In the past, translator fixtures have been constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Typically, the grid tester will include a bottom translator fixture positioned on a grid base and a second or top translator fixture positioned on a separate grid base located above the bottom fixture. The top fixture is inverted above the bottom fixture so that a printed circuit board under test is sandwiched between the top plates of the top and bottom fixtures. The top translator fixture includes the same components as the bottom fixture so that test points on the top surface of the printed circuit board are tested by the top fixture and the test points on the bottom surface of the printed circuit board are simultaneously tested by the bottom fixture. Both sets of test data are interpreted by a single electronic test analyzer.

A problem exists in this arrangement when a density imbalance of test pins occurs on one side of the printed circuit board due to the locations of the test pads. For example, the top surface of the particular circuit board under test may not have any test points in the center of the circuit board. Test pins are contacting test pads on the board under pressure in the center of the lower surface, and due to the lack of counteracting force from the top fixture, the printed circuit board is bent upwardly during testing, which can damage the unit under test. Each translator pin applies a force of approximately 6 to 8 ounces which when multiplied by the number of pins concentrated in a small area of the unit under test can create an unopposed force up to as much as 500 pounds.

To resolve this problem, stand-offs have been incorporated in the center section of the fixture corresponding to the area where no test points are contacting test pads. This effort has proven unsuccessful, however, resulting in not only continued bending of the printed circuit board, but the entire top fixture bending, resulting in damage to both the circuit board and the test fixture. Accurate test data are difficult to obtain when the unit under test and/or the test fixture is bending.

Consequently, a need exists for a test fixture design which provides a counteracting force to the unit under test in locations on the board where a significant number of test pads are located on only one surface.

SUMMARY OF THE INVENTION

Briefly, one embodiment of this invention comprises a translator fixture for a printed circuit board tester of the type having a pattern of test probes on a base upon which the translator fixture is mounted. The tester fixturing includes both a top fixture and a bottom fixture wherein the top fixture is inverted above the bottom fixture. Each translator fixture comprises a plurality of essentially parallel and vertically spaced apart rigid translator plates having selected patterns of pre-drilled holes for supporting translator pins for contacting test points on a printed circuit board supported between the top and bottom translator fixtures. The translator pins translate electrical test signals between test points on the printed circuit board and the test probes in the grid base of the tester.

In one embodiment, each translator fixture includes a plurality of spaced apart translator plate stacking towers of identical construction for supporting the translator plates in their fixed positions in the translator fixture. Each stacking tower has translator plate support surfaces for mounting the translator plates at different levels within the fixture. Each translator plate has a specific pattern of pre-drilled holes for receiving the translator pins used during testing. The stacking towers hold the translator plates at the various levels within the fixture with extreme parallel accuracy.

The top translator plate of either translator fixture will, depending upon the specific requirements of the unit under test, have a number of blind holes drilled in the top plate at locations corresponding to locations where test points on the opposite side of the circuit board are being tested and an unopposed force is being applied by the translator pins in the translator plate containing the blind holes. The blind holes are not drilled completely through the top plate and they receive blind translator pins to apply a counteracting force to the circuit board to prevent the circuit board and the fixture components from bending. The blind holes are positioned in the top plate, and the blind translator pins contained in the blind holes are arranged to apply a force distribution to the circuit board in areas without test pads to counteract the force applied to test pads on the opposite side of the circuit board.

As a result, the counteracting forces applied during testing retain the board in a fixed planar position without undue bending.

These and other aspects of the invention will be more fully understood by referring to the following detailed description and the accompanying drawings.

BRIEF DESCRIPTION OF THE DRAWINGS

FIG. 2 is a semi-schematic side elevational view illustrating a translator fixture constructed and assembled according to principles of this invention; and FIG. 3 is a fragmentary side view of the fixture of FIG. 2 showing a blind hole and pin arrangement in detail.

DETAILED DESCRIPTION

Figure 1:
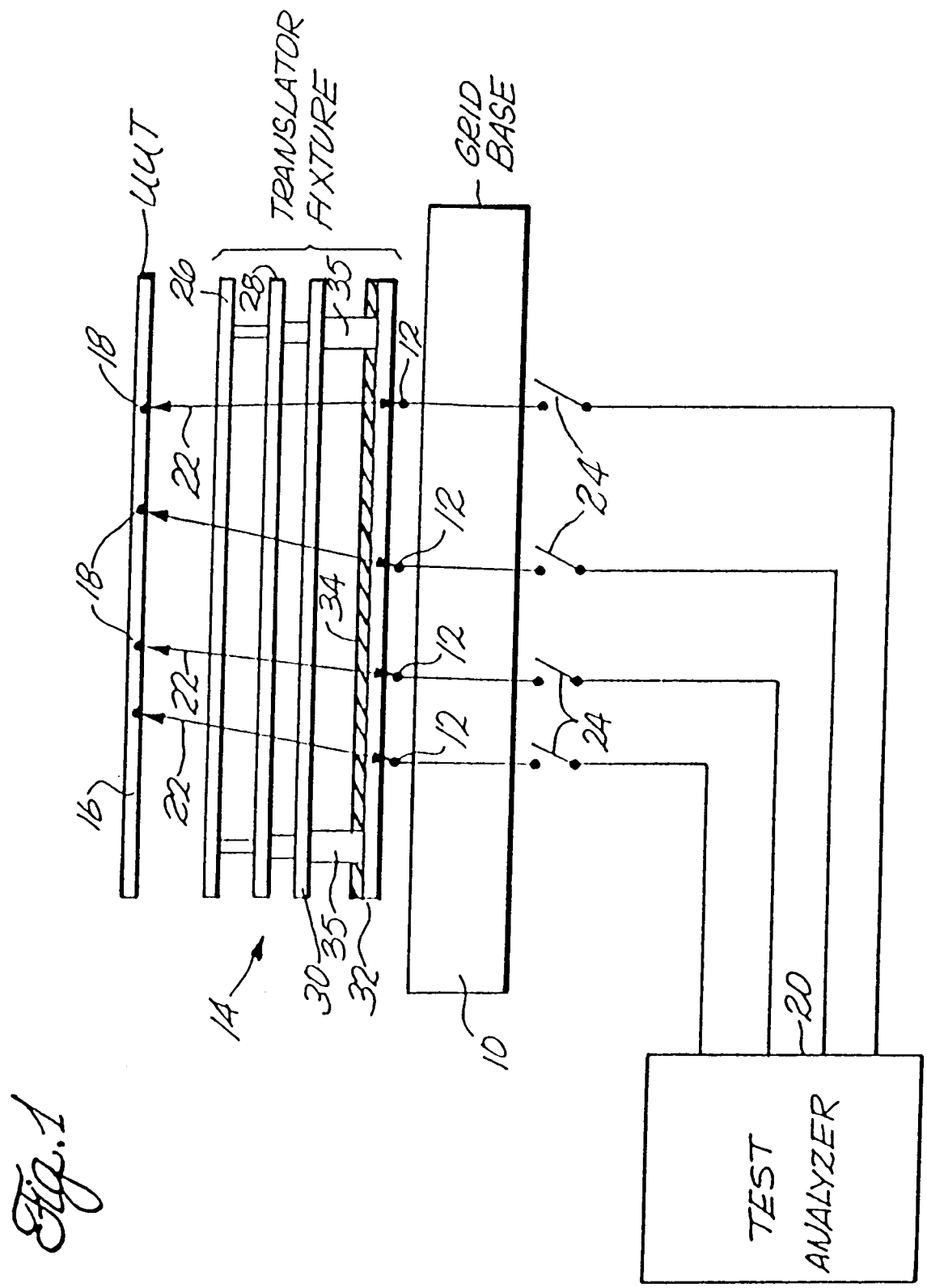
FIG. 1 is a schematic block diagram illustrating components of a dedicated or grid type tester and a translator fixture constructed and assembled according to principles of this invention.

Referring to the schematic block diagram of FIG. 1, a grid-type printed circuit board tester includes a grid base 10 having an array of spring-loaded test probes 12 arranged on a two-dimensional grid pattern. The test probes illustrated schematically in FIG. 1 preferably comprise an orthogonal array of uniformly spaced-apart rows and columns of test probes which may be aligned on 100 mil centers as an example. The spring-loaded plungers of the test probes 12 project above the surface of the grid base uniformly across the array of probes. A translator fixture 14 supports a printed circuit board 16 under test (also referred to as a "unit under test" or UUT). The translator fixture serves as an interface between an array of test points 18 on the board under test and the test probes 12 in the grid base 10. Although only a bottom translator fixture and grid base are illustrated in FIG. 1, it is to be understood there is also a top translator fixture and grid base as described in more detail below. An external electronic test analyzer 20 is electrically connected to the test points in the board under test through test pins in the translator fixture. These test pins (of which there can be several types) are illustrated generally at 22.

The test analyzer 20 contains electronic interrogation circuits to electronically interrogate separate test points 18 of the board under test in order to determine whether or not an electrical connection exists between any two given test points. The electrical connections detected between test points on the tested board are electronically compared with stored reference results obtained from a previous interrogation of test points of a faultless master printed circuit board. The tested board is good if test results match the stored reference results, but if any problem exists in the circuits on the board, the problem is detected by the test results and the bad boards then can be separated from the good boards.

Electronic interrogation circuits in one embodiment comprise a plurality of printed circuit cards (sometimes called "switch cards") having electronic components and printed circuits for carrying out the electronic testing. Each test probe used in the test procedure is represented as being coupled to the test electronics through a corresponding switch 24 leading to the test analyzer. In a given grid-type tester there can be as many as 40,000 switches available for testing the various test points in a board under test.

The translator fixture 14 includes a series of vertically spaced apart and parallel translator plates which may include a top plate 26, an upper plate 28 spaced a short distance below the top plate, a lower plate 30 at approximately an intermediate level of the translator fixture, and a base plate 32 at the bottom of the translator fixture. The translator plates are supported in parallel vertically spaced apart positions by rigid, integral stair-step posts 35 (also referred to as stacking towers) that hold the fixture together as a rigid unit. FIG. 1 illustrates use of four translator plates in the translator fixture; a larger number of translator plates are more commonly used and described in more detail below. The stacking towers 35 also are schematically illustrated in FIG. 1 and are illustrated in more detail in FIG. 2. In one embodiment, the translator fixture comprises a fixture sold under the trademark "ValuGrid" by Everett Charles Technologies, the assignee of this application.

The translator fixture includes an array of standard translator pins such as tilt pins (represented schematically at 22) extending through the translator plates 26, 28, 30 and 32. FIG. 1 illustrates only a few of the standard tilt pins for simplicity. The tilt pins extending through the base plate 32 of the translator fixture are in alignment with the grid pattern of test probes 12 in the grid base 10. The top portions of the tilt pins, which extend through the top plate 26, are in an off-grid pattern aligned to match the random pattern of test points 18 on the UUT. Thus, the tilt pins can be tilted slightly in various three dimensional orientations used to translate between the grid pattern at the base and the off-grid pattern at the top. The standard tilt pins pass through holes in the base plate, through holes in the lower and upper plates, and through a hole pattern in the top plate. The holes in each of the translator plates are drilled in mostly diagonal patterns and the drill patterns are controlled by standard computer-operated software according to well-known procedures. The translator pins are retained in the fixture by an elastomeric pin retention sheet 34.

FIG. 2 illustrates fixturing according to principles of this invention which consists of a bottom fixture 36 and a top fixture 38. Top fixture 38 is mounted directly over bottom fixture 36 in an inverted arrangement. The top and bottom fixtures include translator plates 42 which are mounted to separate stacking towers 44 of identical construction positioned around the periphery of the fixtures. FIG. 2 illustrates one embodiment of a translator fixture wherein the top and bottom fixtures each have eight separate translator plates identified by reference numerals 40a through 40h for the top fixture and 42a through 42h for the bottom fixture, respectively. In this embodiment, ten stacking towers 44 support the translator plates in the fixture. Alignment holes are spaced apart around the periphery of the translator plates to receive the stacking towers which are locked in place in the translator plate. The specific construction, alignment, and location of the locking towers is disclosed in detail in applicant's U.S. patent application Ser. No. 08/531,720, filed Sep. 21, 1995, the disclosure of which is incorporated herein by this reference.

In use, the translator plates are stacked over the top of each stacking tower in a predetermined sequence. The translator fixtures further include a plurality of molded plastic spacers 46 which form stand-off posts to further support the translator plates in parallel alignment.

As seen best in FIG. 3, each translator plate has a corresponding unique pattern of pre-drilled holes 49 for retaining the tilt pins 47 at a given level of the translator fixture. FIG. 3 illustrates that portion of the top fixture 38 and bottom fixture 36 within the dashed lines shown in the center of FIG. 2. More specifically, FIG. 3 illustrates holes 49a through 49f in top plate 42a of bottom fixture 36, and in top plate 40a of top fixture 38. Tilt pins 47a through 47f are positioned in holes 49a through 49f to contact test pads 50a through 50f on the upper and lower surfaces of the printed circuit board 16. Spring loaded test probes 12 (FIG. 2) produce a force on tilt pins 47a through 47f for electrical contact with test pads 50a through 50f.

Blind holes 52a through 52d are drilled in top plate 40a of the top fixture, above the region of the printed circuit board 16 where no test pads are located. The blind holes 52a through 52d are aligned vertically with corresponding test pads 50c through 50f located in top plate 42a of the bottom fixture. Blind pins 54a through 54f are positioned in blind holes 52a through 52d to apply counteracting forces to the forces applied by tilt pins 47c through 47f which are positioned in the bottom fixture in contact with the test pads 50c through 50f. Blind pins 54a through 54d are in non-electrical contact with the printed circuit board because blind holes 52a through 52d are not drilled entirely through top plate 40a, leaving a web 56 of electrically insulating plastic material approximately 15 to 20 mils thick between the holes and the unit under test. The web 56 as a flat bottom face continuous with the bottom face of the translator plate 40a for contact with the UUT. Blind pins 54 are preferably in non-electrical contact with the printed circuit board to avoid the possibility of damaging the unit under test. The counteracting force of the blind pins is applied by the spring loaded test probes 12 of top fixture 38. Alternatively, the blind holes could pass entirely through the top plate and blunt tilt pins could be used to apply the counteracting force.

As best illustrated in FIG. 3, the blind pins are straight solid pins of the same size and configuration as the translator pins. Thus, the diameters of the blind holes can be the same as the diameters of the standard through-holes for the translator pins. The blind pins are preferably aligned vertically in the fixture, as opposed to the translator pins which can be tilt pins positioned in any given three-dimensional orientation.

Fixturing software is designed to recognize the location of the blind pins which will be protruding out of the fixture at the test probes 15 to 20 mils higher than the tilt pins contacting the test pads. The software is programmed so that the test probes which contact the blind pins will compensate the pressure applied by the probes due to the height difference for the blind pins, so that applied pressures on both sides of the board will be essentially uniform. The system software is designed, however, so that electrical test signals are not applied to the blind pins.

It is to be understood that although the invention has been described with respect to the upper surface of the printed circuit board as having an area with no test pads, the blind hole and pin arrangement can be incorporated into either top plate of the top or bottom fixture to compensate for tilt pin force imbalance due to the density of test pads on any given surface of the unit under test.

What is claimed is:

1. A translator fixture for a printed circuit board tester of the type having a pattern of test probes on a base upon which the translator fixture is mounted, the translator fixture comprising:

a plurality of essentially parallel and vertically spaced apart rigid translator plates supported in a fixed position in the translator fixture and having selected patterns of holes aligned in the translator plates for containing and supporting translator pins extending through the translator plates and positioning the translator pins for contacting test points under pressure on a printed circuit board supported in an essentially horizontal position adjacent to and on an upper translator plate of the translator fixture, the translator pins translating electrical test signals between the test points on the printed circuit board and the test probes on the base of the tester;

one or more blind holes in the upper translator plate for alignment with a region of the printed circuit board where no test points are located, each blind hole extending through only a portion of the depth of the upper translator plate so that a remaining portion of the translator plate in alignment with the blind hole is in non-electrical contact with said region of the circuit board; and a separate blind pin extending through the translator plates of the fixture and into each blind hole in the upper translator plate, for applying a balancing force to the printed circuit board through the upper translator plate in response to pressure applied to the other side of the board opposite from the region containing no test points.

2. The fixture of claim 1 wherein the non-conductive remaining portion of each blind hole has a thickness in the range of about 15 to about 20 mils.

3. The fixture according to claim 1 in which the blind pins comprise straight solid pins of a size and configuration similar to the translator pins.

4. A translator fixture for a printed circuit board tester of the type having a pattern of test probes on an upper base and a lower base between which the translator fixture is mounted, the translator fixture comprising:

a bottom translator fixture;

a top translator fixture axially aligned in an inverted position over the bottom translator fixture;

each top and bottom translator fixture including a plurality of essentially parallel and vertically spaced apart rigid translator plates supported in a fixed position and having selected patterns of holes aligned in the translator plates for contacting and supporting translator pins extending through the translator plates and positioning the translator pins for contacting test points under pressure on top and bottom surfaces of a printed circuit board supported in an essentially horizontal position between and in contact with a top plate of the top fixture and a top plate of the bottom fixture, respectively, the pins translating electrical test signals between the test points on the printed circuit board and the test probes at the bases of the tester; and blind test pins extending through the translator plates in at least one of the translator fixtures and into corresponding blind holes in an upper translator plate adjacent the circuit board for non-electrically applying a balancing force through the upper translator plate to a region of the circuit board containing no test points on a side of the board opposite from a force applied to test points on the board from translator pins in the other translator fixture.

5. The fixture of claim 4 wherein the blind hole extends partially through the upper translator plate defining a web of non-conductive material in the top plate between the blind hole and the printed circuit board.

6. The fixture of claim 5 wherein the web has a thickness in the range of about 15 to about 20 mils.

7. The fixture of claim 4 in which the blind pins comprise straight solid pins similar in size and configuration to the translator pins.

8. A translator fixture for a printed circuit board tester of the type having a pattern of test probes on a base upon which the translator fixture is mounted, the translator fixture comprising:

a bottom fixture;

a top fixture axially aligned in an inverted position over the bottom fixture, each of the bottom fixture and the top fixture mounted on a separate base;

each top and bottom fixture including a plurality of essentially parallel and vertically spaced apart rigid translator plates supported in a fixed position having selected patterns of holes aligned in the translator plates for containing and supporting translator pins extending through the translator plates and positioning the translator pins for contacting test points under pressure on a printed circuit board supported in an essentially horizontal position between and in contact with a top plate of the top fixture and a top plate of the bottom fixture, the pins translating electrical test signals between the test points on the printed circuit board and the test probes on the base of the tester; and a plurality of blind pins located within blind holes in the top plate of the top fixture adjacent the printed circuit board at a location on the board where no test points are located, the blind pins applying a balancing force to the printed circuit board through the top plate and are axially aligned with translator pins translating electrical test signals between test points on the printed circuit board.

9. The fixture of claim 8 wherein the blind holes extends substantially through the top plate defining a web in the top plate between the blind hole and the printed circuit board.

10. The fixture of claim 9 wherein the web has a thickness in the range of about 15 to about 20 mils.

* * * * *